(12) United States Patent
He et al.

(10) Patent No.: US 7,720,137 B2
(45) Date of Patent: May 18, 2010

(54) CHARACTERIZATION OF A FREQUENCY RESPONSE FOR A FREQUENCY TRANSLATION DEVICE

(75) Inventors: Yi He, Portland, OR (US); Marcus K. Da Silva, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 750 days.

(21) Appl. No.: 11/583,188

(22) Filed: Oct. 18, 2006

(65) Prior Publication Data

US 2008/0095271 A1    Apr. 24, 2008

(51) Int. Cl.
*H04B 17/00* (2006.01)

(52) U.S. Cl. .................. 375/224; 375/316; 375/241; 375/222; 702/112; 702/104; 702/108; 702/182

(58) Field of Classification Search ................. 375/224, 375/308, 316, 222, 241; 702/112, 104, 108, 702/182; 324/76, 750, 615
See application file for complete search history.

(56) References Cited

U.S. PATENT DOCUMENTS

| | | | | |
|---|---|---|---|---|
| 6,041,077 A | * | 3/2000 | Clark et al. | 375/224 |
| 6,405,147 B1 | * | 6/2002 | Fera | 702/112 |
| 6,842,608 B2 | * | 1/2005 | Cutler | 455/67.14 |
| 2006/0158174 A1 | * | 7/2006 | Marzalek et al. | 324/76.19 |

* cited by examiner

*Primary Examiner*—Chieh M Fan
*Assistant Examiner*—Eva Y Puente
(74) *Attorney, Agent, or Firm*—Francis I. Gray; Michael A. Nelson

(57) ABSTRACT

A method of characterizing the frequency response of a frequency translation device over a wide IF bandwidth is based on a two-dimensional model to generate calibration data for a device at run-time. The model is a function of a center frequency and frequency offset for a plurality of center frequencies over a wide system bandwidth to produce a frequency response at each center frequency. The frequency responses at each center frequency are scaled and normalized relative to a reference frequency and stored.

4 Claims, 3 Drawing Sheets

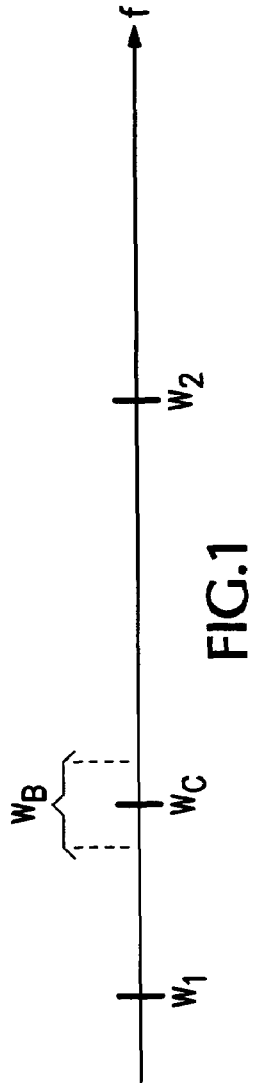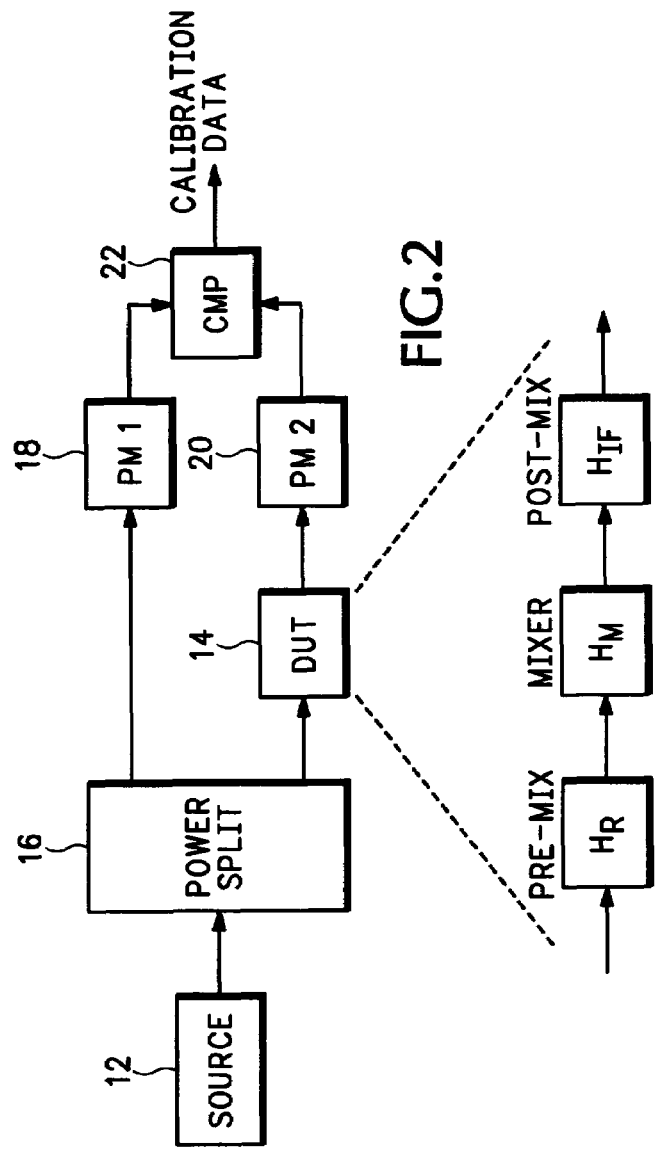

CHARACTERIZATION OF A FREQUENCY RESPONSE FOR A FREQUENCY TRANSLATION DEVICE

BACKGROUND OF THE INVENTION

The present invention relates to the characterization of a frequency response for a device, and more particularly to the characterization of a frequency response for the frequency translation device over a specified wide bandwidth at multiple center frequencies covering a wide system bandwidth.

Frequency translation devices, such as mixers that combine an input signal with a frequency from a local oscillator to translate the input signal to a different frequency, are important components in radio frequency (RF) systems. The conversion by the mixers of RF power at one frequency into power at another frequency makes signal processing at a receiver or signal generating at a transmitter easier and more efficient. For modern RF systems minimizing linear distortion along a signal path, including contributions from the frequency translation devices, is critical to meet signal quality requirements, such as Error Vector Magnitude (EVM) for communication systems.

In an RF device the mixer is just one building block in any signal path. Other cooperating circuits need to be considered since the mixer interacts with both the preceding and subsequent circuits in the signal path, as well as local oscillator (LO) driving circuits. All mixers are not fully isolated, leading to leakage or feed-through between mixer ports. Also mixers are non-linear devices which inevitably result in intermodulation distortion. In traditional narrow bandwidth systems, such as 1-10 MHz intermediate frequency (IF) bandwidth systems, the mixers may be approximated as having ideal frequency responses, i.e., flat gain and linear phase over the IF bandwidth, without causing too much degradation in system performance. RF devices, such as traditional spectrum analyzers, make this assumption and only perform channel calibration and alignment at each center frequency. The differences in frequency responses over the IF bandwidth between the center frequencies are ignored. This alignment technique works reasonably well for narrow bandwidth systems. However for wide bandwidth systems, such as RF devices having signal paths with an IF bandwidth of 100 MHz and greater, the interaction between the mixer and cooperating circuits gets more complicated and worse. Considerable errors occur if the mixer response over the bandwidth of interest is assumed to be the same for every center frequency. This results in distorted signals being emitted by transmitters and/or errors being generated in receivers. In test equipment, such distortions or errors may result in the inability to reliably determine whether or not an RF device being tested meets required specifications.

What is desired is a method of characterizing the frequency response of a frequency translation device over a specified wide bandwidth in conjunction with cooperating circuits for a wide system bandwidth in order to provide greater accuracy for RF devices using the frequency translation device.

BRIEF SUMMARY OF THE INVENTION

Accordingly the present invention provides a technique for characterizing a frequency translation device over a wide system bandwidth of frequencies to generate a series of frequency responses. The frequency translation device is modeled as a two-dimensional (2D) function of a center frequency and a frequency offset. A stimulus generator provides an RF signal that includes the center frequency and covers a specified bandwidth about the center frequency, such as by stepping in frequency increments about the center frequency or modulating the center frequency by a second signal having a bandwidth equal to or greater than the specified bandwidth. The wide range of frequencies includes a plurality of channels, with each channel having a unique center frequency. For each channel a series of magnitude and phase measurements are taken of both the stimulus and the output from the frequency translation device at each of a plurality of frequency offsets centered on the center frequency over the specified bandwidth for the channel. The pairs of magnitude and phase measurements are compared and the ratio between them represents the frequency response of the frequency translation device. The process is repeated for each channel within the wide bandwidth of the RF system. The frequency responses for each channel may be stored compactly as calibration data by scaling and normalizing with respect to the frequency response for a reference frequency. The calibration data may be used to provide a figure of merit for mixer performance, or may be used during run-time normalization of a transmitter or receiver to construct an appropriate inverse filter at any desired center frequency to remove distortion from the transmitted signal or reduce errors in the signal processing by the receiver.

The objects, advantages and other novel features of the present invention are apparent from the following detailed description when read in conjunction with the appended claims and attached drawing.

BRIEF DESCRIPTION OF THE SEVERAL VIEWS OF THE DRAWING

FIG. 1 is a graphic view of a communication system having multiple channel carriers over a wide system bandwidth of frequencies, each channel having a specified wide bandwidth.

FIG. 2 is a block diagram view of a system using a stepped CW signal for characterizing the frequency response of a device under test containing a frequency translation device according to the present invention.

DETAILED DESCRIPTION OF THE INVENTION

Figure 3:
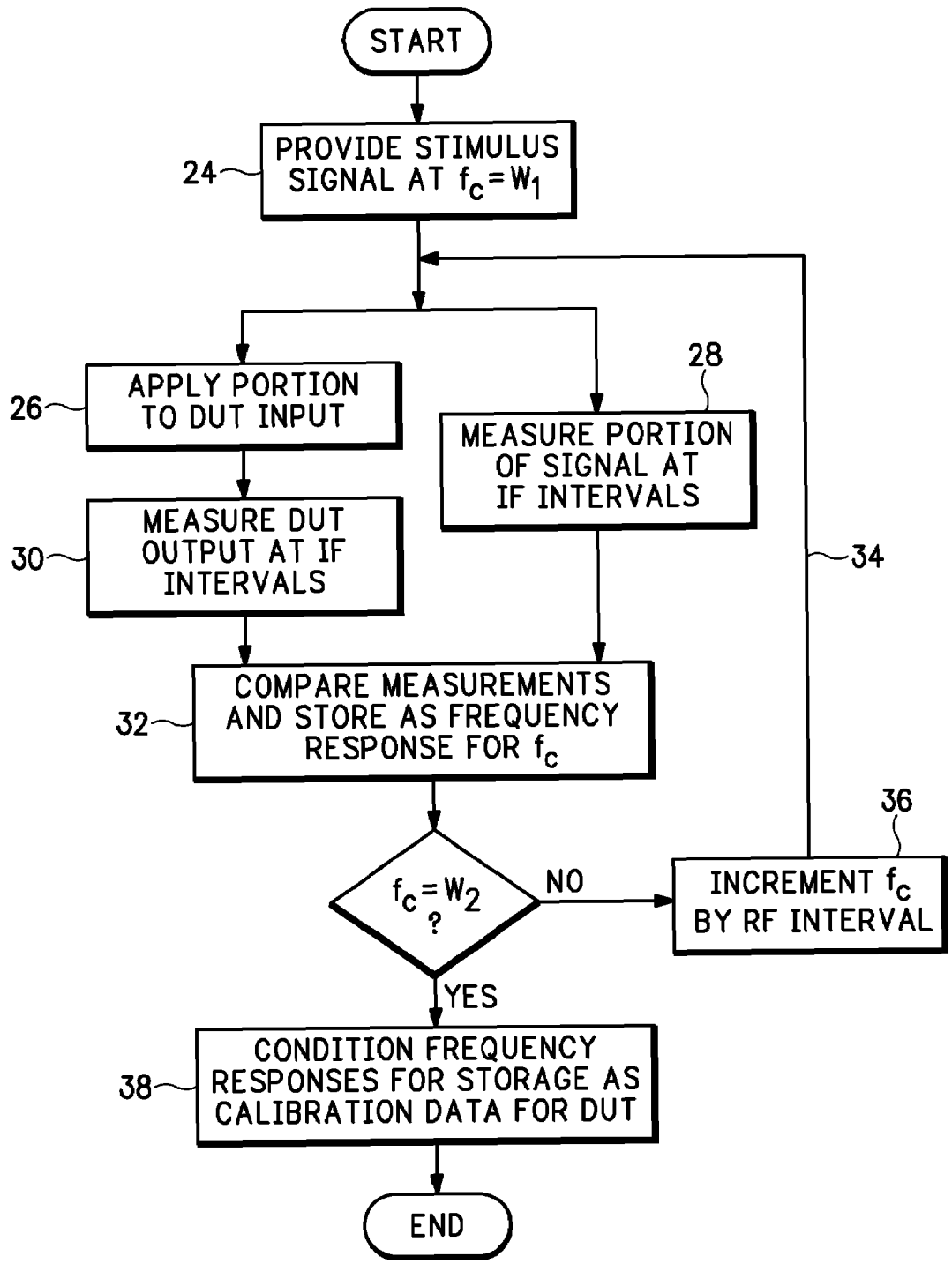
FIG. 3 is a flow chart view of the process for characterizing the frequency response of a frequency translation device according to the present invention.

For the following discussion "calibration" refers to the factory calibration of a device using external test equipment, and "normalization" or "alignment" refers to device self-calibration using an internal test signal.

Referring now to FIG. 1 a typical RF system has multiple channels over a wide system bandwidth, such as tens of gigaHertz, each channel having a unique center frequency, $\omega_c$, and a specified channel bandwidth, $\omega_b$, on the order of 100 MHz or greater for state of the art wide band systems. The wide system bandwidth covers a frequency range from a start center frequency, $\omega_1$, to a stop center frequency, $\omega_2$. A channel frequency response at a device is modeled as follows:

$$H(\omega,\omega_c)=H_R(\omega+\omega_c)H_M(\omega,\omega_c)H_{IF}(\omega)$$

where H is the overall channel frequency response, $H_R$ is the frequency response preceding a mixer, $H_M$ is the RF mixer frequency response, $H_{IF}$ is the combined frequency response of the circuits following the mixer and ω is the frequency offset from the channel center frequency, $\omega_c$. The frequency response may be expressed as a complex function that contains both magnitude and phase information. As a result the magnitude of the frequency response may be expressed as an absolute value of the complex frequency response. By recognizing that the mixer and its interacting circuits are essentially not separable, the combined frequency response is characterized and may be used as a correction factor for a transmitter or receiver, or as a figure of merit for the mixer.

As shown in FIG. 2 during initial calibration a signal source 12, such as a stepped continuous wave (CW) signal generator, swept CW signal generator, modulated CW signal (multitone) generator or the like, provides an RF signal that is varied across each channel of a device under test (DUT) 14, either by stepping a frequency for the RF signal across the channel bandwidth about a center frequency, sweeping the frequency for the RF signal across the channel bandwidth about the center frequency, modulating the center frequency with a second signal having a frequency equal to or greater than the channel bandwidth, or the like. For ease of understanding the following description assumes that the signal source 12 is a stepped CW signal generator. The RF signal from the signal generator 12 is input to a power splitter 16 that provides a portion of the power from the RF signal to an input port of the DUT 14 and an equal portion of the power to a first power meter 18. A second power meter 20 is coupled to an output port of the DUT 14. The power meters 18, 20 are magnitude measurement systems. The magnitude of the RF signal at each frequency step, as measured by the first power meter 16, is compared (22) with the magnitude of the RF signal output from the DUT 14, as measured by the second power meter 20. The resulting differences in magnitude in dB as measured by the respective power meters 18, 20 represents the frequency response of the DUT 14 for the particular channel. This calibration process occurs for each channel within the wide system bandwidth to provide a separate frequency response for each channel or center frequency.

More specifically as shown in FIG. 3 during the characterization phase the RF signal from the signal generator 12 is used as a stimulus signal, which is split between the first power meter 18 and the DUT 14. The power measurement starts at the start center frequency, $\omega_1$, (step 24) with a predefined portion of the signal being applied to an input of the DUT 14 (step 26). For each channel the signal generator 12 is stepped across the channel bandwidth using a predefined frequency step, called an "IF frequency" step. For example if $\omega_b$=100 MHz and the IF frequency step is 10 MHz, then the following frequencies are tuned from the center frequency, $\omega_c$: ω=−50 MHz, −40 MHz, . . . 40 MHz, 50 MHz where ω=0 at $\omega_c$. For each offset frequency the magnitudes of the stimulus signal and device output are measured (steps 28, 30). The difference in dB between the readings from the power meters 18, 20 is stored at each frequency step over the channel bandwidth to produce the frequency response (step 32). The process is repeated (step 34) for each channel center frequency from $\omega_1$ to $\omega_2$ by incrementing the center frequency by a predefined RF frequency step (step 36).

Figure 4:
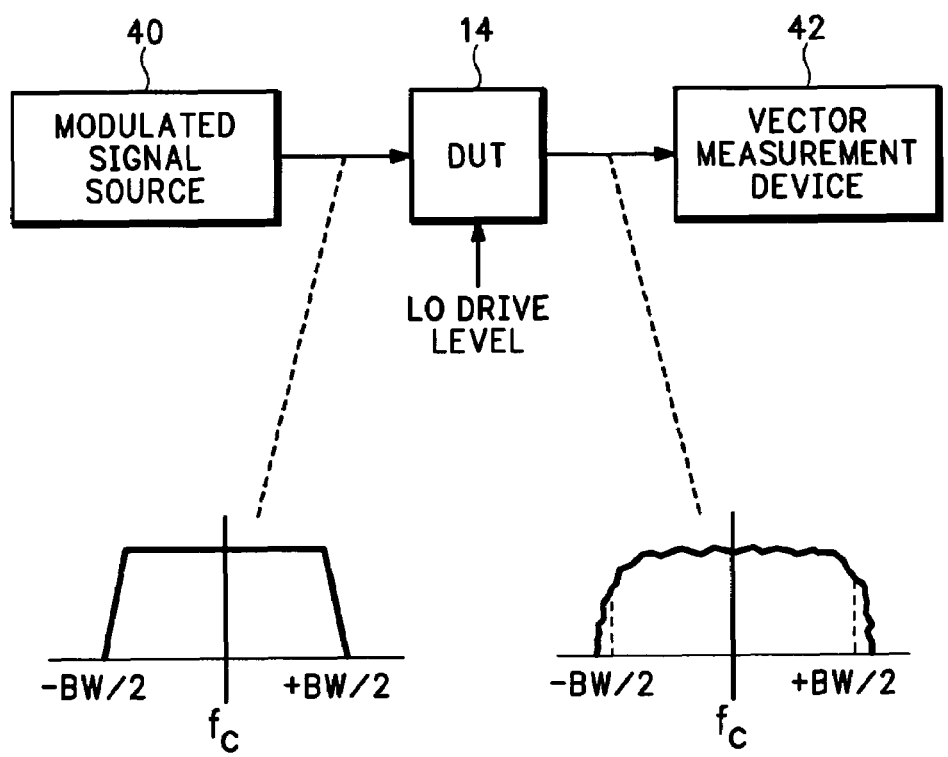
FIG. 4 is a block diagram view of a system using a modulated signal for characterizing the frequency response of a device under test containing a frequency translation device according to the present invention.

The IF and RF frequency steps or intervals are selected so that any interpolation error introduced at an arbitrary center frequency and frequency offset is much smaller than any specifications under consideration. While fine steps result in better accuracy, it takes longer to calibrate and requires a larger data store for keeping the calibration data. The phase data may be derived from the magnitude data, if required, by assuming the system is a minimum phase system, as described in co-pending U.S. patent application Ser. No. 11/272,285 filed Nov. 9, 2005 entitled "Filter Equalization Using Magnitude Measurement Data." Where, as shown in FIG. 4, a signal source 40 provides a modulated signal, the amplitude and phase may be measured directly at the same time at IF frequencies covering the specified channel bandwidth using a measurement device 42 attached to the DUT 14. Similar to the procedure described above for the stepped CW signal, the entire wide system bandwidth is covered by incrementing the center frequency by the RF frequency step.

Prior to saving the calibration results in a data store, the following conditioning (step 38) is preferably performed. These steps help to reduce the amount of calibration data and improve the accuracy of interpolation for determining the frequency response of the DUT 14 at any desired center frequency. The frequency response for each channel is scaled with respect to a reference frequency, which for convenience may be the alignment frequency referenced above:

$$|H(\omega, \omega_c)| = |H_R(\omega + \omega_c)H_M(\omega, \omega_c)H_{IF}(\omega)| -$$
$$|H_R(\omega + \omega_r)H_M(\omega, \omega_r)H_{IF}(\omega)|$$
$$= |H_R(\omega + \omega_c)H_M(\omega, \omega_c)| - |H_R(\omega + \omega_r)H_M(\omega, \omega_r)|$$

where $\omega_r$ is the reference or alignment frequency and the magnitude terms are expressed in dB. Then for the frequency response at each center frequency subtract the frequency response at center (ω=0) from each frequency response:

$$|H_2(\omega,\omega_c)|=|H_1(\omega,\omega_c)|-|H_1(0,\omega_r)|$$

where $H_1$ is the scaled channel frequency response for a particular channel, and $H_2$ is the stored frequency response for that channel.

From the calibration data the frequency response at any arbitrary center frequency may be determined by interpolating the frequency response along the RF frequencies for every IF frequency used in the calibration. If a fine IF frequency resolution is desired, then the calibration IF frequency step is used and the frequency response along the IF frequencies may also be interpolated. In both cases common interpolation methods, such as a cubic spline, may be used.

A source, such as a transmitter, also has a mixer, the frequency response of which may be characterized as indicated above. The frequency response may then be used in the transmitter to predistort the signal output to compensate for the mixer in the transmitter. This is especially useful for a precision arbitrary signal generator which requires the production of an RF signal having known characteristics for testing RF devices.

Also, using a receiver that is corrected for its own frequency response, as described above, any variations in a signal having known characteristics may be considered to be the result of variations in the frequency response of the source. Since such variations may be distinct for each source, such variations may be used as a signature to identify the particular source from which the signal is received.

Thus the present invention provides a technique for characterizing frequency translation devices as a two-dimensional function of a center frequency and an offset frequency to model the frequency response, normalizing the resulting calibration data to a reference frequency to reduce the amount of calibration data for storage, and interpolating from the calibration data a frequency response at any arbitrary center frequency.

What is claimed is:

1. A method of characterizing a frequency response for a frequency translation device having a specified wide bandwidth comprising:
applying a stimulus signal at an input of the frequency translation device, the stimulus signal having a center frequency and covering a plurality of offset frequencies that define the specified wide bandwidth spanning the center frequency;
measuring the stimulus signal and an output from the frequency translation device in response to the stimulus signal to generate a frequency response for storage as calibration data for the frequency translation device at the center frequency, the frequency response being a complex function of magnitude and phase over the specified wide bandwidth;
repeating the applying and measuring steps for each of a plurality of center frequencies spanning a desired frequency range to generate a plurality of frequency responses, one for each center frequency; and
conditioning each frequency response with respect to a reference center frequency prior to storage as the calibration data, wherein the conditioning comprises each frequency response is scaled and normalized relative to said reference center frequency.

2. The method as recited in claim 1 wherein the stimulus signal is one selected from the group consisting of a stepped continuous wave signal, a swept continuous wave signal, a multi-tone signal and a modulated signal that spans the specified wide bandwidth.

3. The method as recited in claim 1 wherein the frequency translation device comprises a component in a signal generation device having a calibrated bandwidth about the plurality of center frequencies.

4. The method as recited in claim 1 wherein the frequency translation device comprises a component in a receiving device having a calibrated bandwidth about the plurality of center frequencies.

* * * * *